United States Patent
Casper

(10) Patent No.: US 6,345,012 B1
(45) Date of Patent: *Feb. 5, 2002

(54) TRI-STATING ADDRESS INPUT CIRCUIT

(75) Inventor: Stephen L. Casper, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/233,299

(22) Filed: Jan. 19, 1999

Related U.S. Application Data

(62) Division of application No. 08/871,364, filed on Jun. 9, 1997, now Pat. No. 6,154,056.

(51) Int. Cl.[7] .................................................. G11C 8/00
(52) U.S. Cl. .......................... 365/230.08; 365/230.02; 365/230.06
(58) Field of Search .............................. 326/56, 57, 58; 365/230.02, 230.06, 230.08

(56) References Cited

U.S. PATENT DOCUMENTS

| | | | |
|---|---|---|---|
| 4,581,718 A | 4/1986 | Oishi .......................... | 365/189 |
| 4,958,088 A | 9/1990 | Fara-Bakhsh et al. ...... | 307/443 |
| 5,073,873 A | 12/1991 | Nogami ................. | 365/189.05 |
| 5,150,186 A | 9/1992 | Pinney et al. .................. | 357/42 |
| 5,229,965 A | 7/1993 | Inoue ..................... | 365/189.04 |
| 5,274,276 A | 12/1993 | Casper et al. ............... | 307/443 |
| 5,278,460 A | 1/1994 | Casper ..................... | 307/296.5 |
| 5,347,179 A | 9/1994 | Casper et al. ............... | 307/451 |
| 5,361,002 A | 11/1994 | Casper ........................ | 327/530 |
| 5,612,630 A | 3/1997 | Wright et al. ................. | 326/22 |
| 5,619,511 A | 4/1997 | Sugisawa et al. ........... | 714/726 |
| 5,633,833 A | 5/1997 | Yoon .................... | 365/230.08 |
| 6,154,056 A | 11/2000 | Casper ........................ | 326/58 |

*Primary Examiner*—David Nelms
*Assistant Examiner*—Gene Auduong
(74) *Attorney, Agent, or Firm*—Schwegman, Lundberg, Woessner & Kluth, P.A.

(57) ABSTRACT

An address buffer for a memory device comprises a tri-state input stage, an address output latch, and an inverter that are successively coupled. In one embodiment, the address buffer uses address enable signals for controlling both the tri-state input stage and the address output latch. In another embodiment, the tri-state input stage includes series coupled pairs of N and P channel transistors. The address signal is provided to gates of one P channel and one N channel transistor which form an inverter. The other two transistors have their gates coupled to the address enable signal and its complement for enabling the tri-state input stage. In another embodiment, the address output latch includes a multiplexed feedback loop that is controlled by the address enable signal and its complement. A method of operating the buffer comprises sampling a signal. The sampled signal is inverted. The inverted sampled signal is latched. Finally, the latched signal is inverted. The sampling and latching steps occur mutually exclusively.

31 Claims, 5 Drawing Sheets

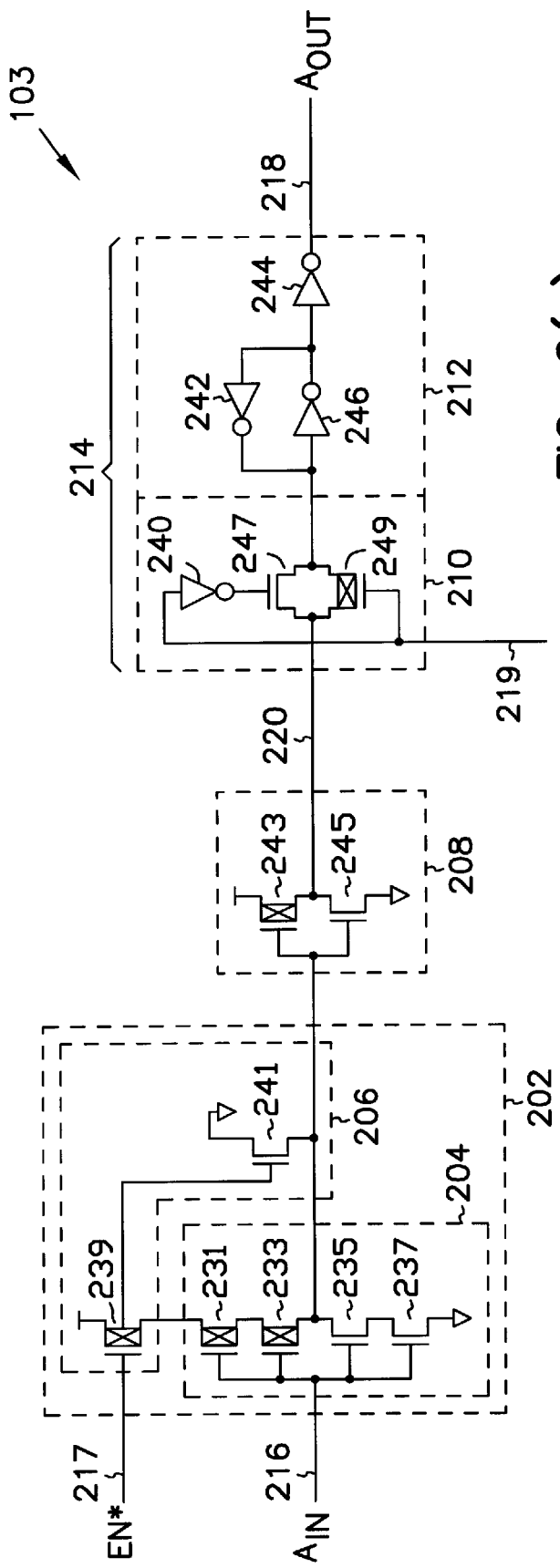
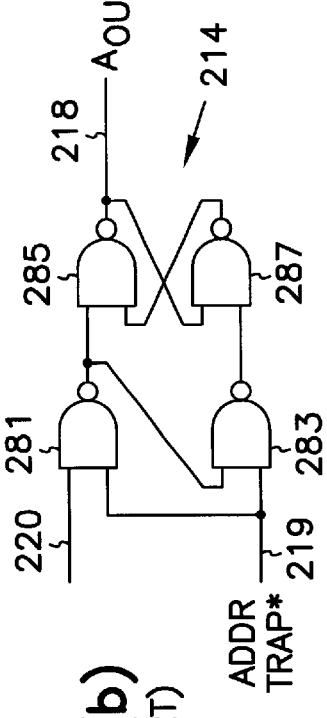
FIG. 2(a) (PRIOR ART)
FIG. 2(b) (PRIOR ART)

TRI-STATING ADDRESS INPUT CIRCUIT

This application is a divisional of U.S. Ser. No. 08/871,364 file Jun. 9, 1997 now U.S. Pat. No. 6,154,056.

FIELD OF THE INVENTION

The present invention relates generally to integrated circuits, and more specifically to an address input circuit for semiconductor memory devices.

BACKGROUND OF THE INVENTION

Integrated circuits, such as microprocessors and memories, routinely transmit data to one another. However, an integrated circuit receiving data may not be able to process the data immediately upon receipt because the integrated circuit is in the midst of other operations. For example, a memory may not be able to access data from some memory cells whose addresses are transmitted from a microprocessor because the memory is performing other internal operations. Therefore, buffers are necessary at the inputs of many integrated circuits, such as memories. Data, such as a memory address, is stored in the buffer until the integrated circuit is ready to process the data.

Because the integrated circuit may require the received data immediately, the buffer should be fast. Conventional buffers include circuitry, such as multiplexors and permanent feedback loops, to latch the address. FIG. 1 illustrates a prior art buffer 100, including successively coupled input, gain, and output stages 102, 104, 114. The prior art buffer includes a multiplexor 110 and an inverter latch 112 in its output stage 114. An address signal, $A_{IN}$, is sampled and inverted by the input stage 102 when a relatively low voltage is applied at EN* (or address enable signal complement). When ADDR TRAP (or address trap signal) is biased with a relatively low voltage, the multiplexor 110 couples the sampled address signal into the output stage 114 where the sampled address signal is latched at the inverter latch 112, and further inverted to provide $A_{OUT}$ (or latched address signal).

At least five gate delays are encountered in this buffer, greatly diminishing the speed of the buffer. Buffer speed is also reduced by the permanent feedback loop formed by the inverter latch 112 which requires relatively more time to change its state.

There is a need to increase buffer speed. Thus, there is a further need to reduce the circuitry in the path that the sampled address signal must travel in the buffer while maintaining the ability to reliably buffer addresses.

SUMMARY OF THE INVENTION

An address buffer for a memory device comprises an input inverter and a pair of inverters having a multiplexed feedback loop operating as a multiplexed address output latch. An output of the latch is inverted again to provide the address to the memory device. Providing the multiplexor in a feedback loop reduces gate delays encountered in prior input buffers.

In one embodiment, the address input buffer uses address enable signals for controlling both a tri-state input stage, and for enabling the feedback loop in the address output latch. Using the same set of address enable signals for both the input stage and the feedback loop of the address output latch, simplifies control of the address buffer.

When the input stage samples the address, the feedback loop is inoperative. When the input stage is not enabled, the feedback loop latches the address. Furthermore, the feedback loop is not permanent, only being activated when the tri-state input stage is disabled. Because the feedback loop is not permanent and the multiplexor is not in the speed path that the sampled address signal must travel, the speed of the buffer circuit is enhanced over prior devices having either a multiplexor in the speed path or a series of logic gates to perform latching functions. Furthermore, the number of gates required to implement the address buffer is reduced.

In one embodiment, the tri-state input stage is operatively coupled to the address output latch. The tri-state input stage includes series coupled pairs of N and P channel transistors. The address signal is provided to gates of one P channel and one N channel transistor which form an inverter. The other two transistors have their gates coupled to the address enable signal and its complement for enabling the inverter. An output of the inverter is coupled to the address output latch which comprises two series coupled inverters. An output of the second inverter of the latch is fed back through a multiplexor to an input of the first inverter of the latch. The address enable signal and its complement provide control signals to the multiplexor. The output of the address output latch is coupled to a third inverter.

In another embodiment, the multiplexor comprises an N channel transistor operatively coupled to the complement of the address enable signal. A P channel transistor is operatively coupled to the address enable signal and in parallel with the N channel transistor.

A method of operating the buffer comprises sampling a signal. The sampled signal is inverted. The inverted sampled signal is latched. Finally, the latched signal is inverted. The sampling and latching steps occur mutually exclusively.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the leftmost digit(s) of a reference number corresponds to the drawing number in which the reference number first appears.

DETAILED DESCRIPTION OF THE EMBODIMENTS

In the following detailed description of the preferred embodiments, reference is made to the accompanying drawings which form a part hereof, and which is shown by way of illustration specific embodiments in which the inventions may be practiced. These embodiments are described in sufficient detail to enable persons skilled in the art to practice the invention, and it is to be understood that other embodiments may be utilized and that mechanical and logical changes may be made without departing from the spirit and scope of the present invention. The following detailed description is, therefore, not to be taken in a limiting sense, and the scope of the present invention is defined only by the appended claims.

Figure 1:
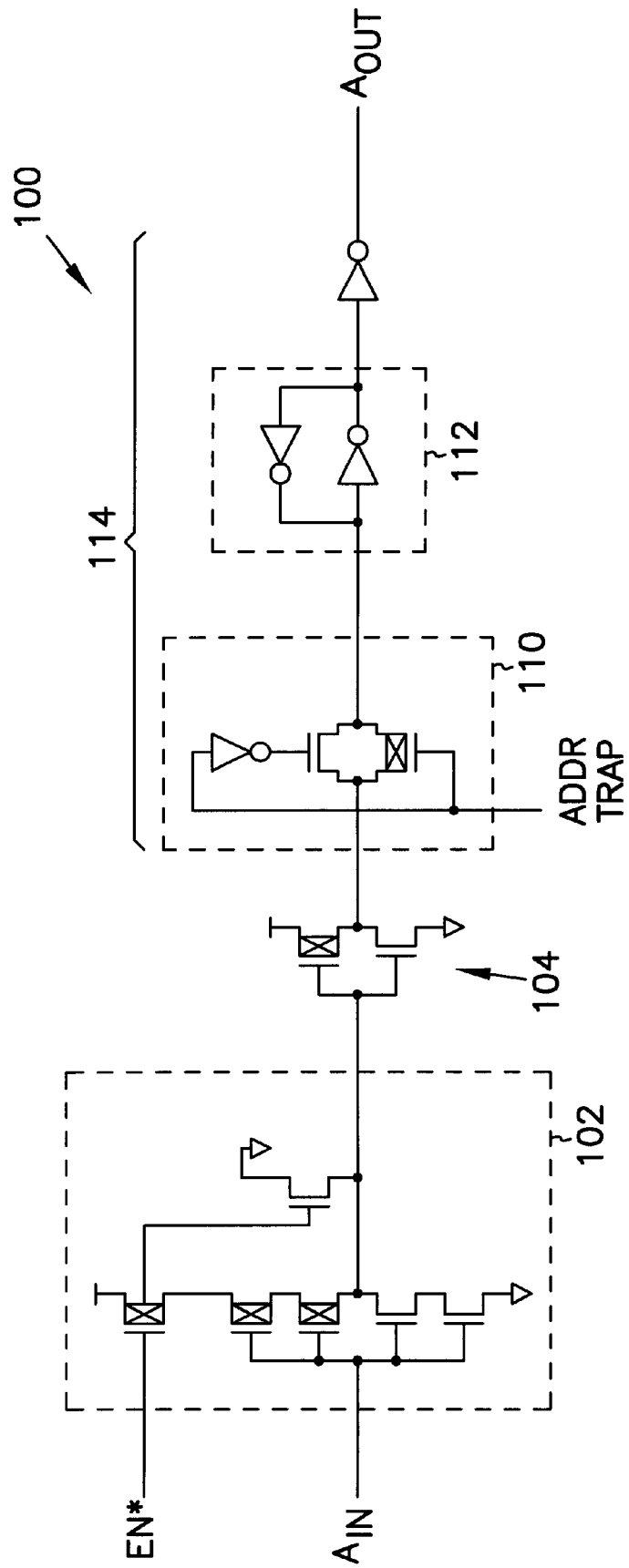
FIG. 1 is a prior art schematic diagram of a buffer.
Figure 2:
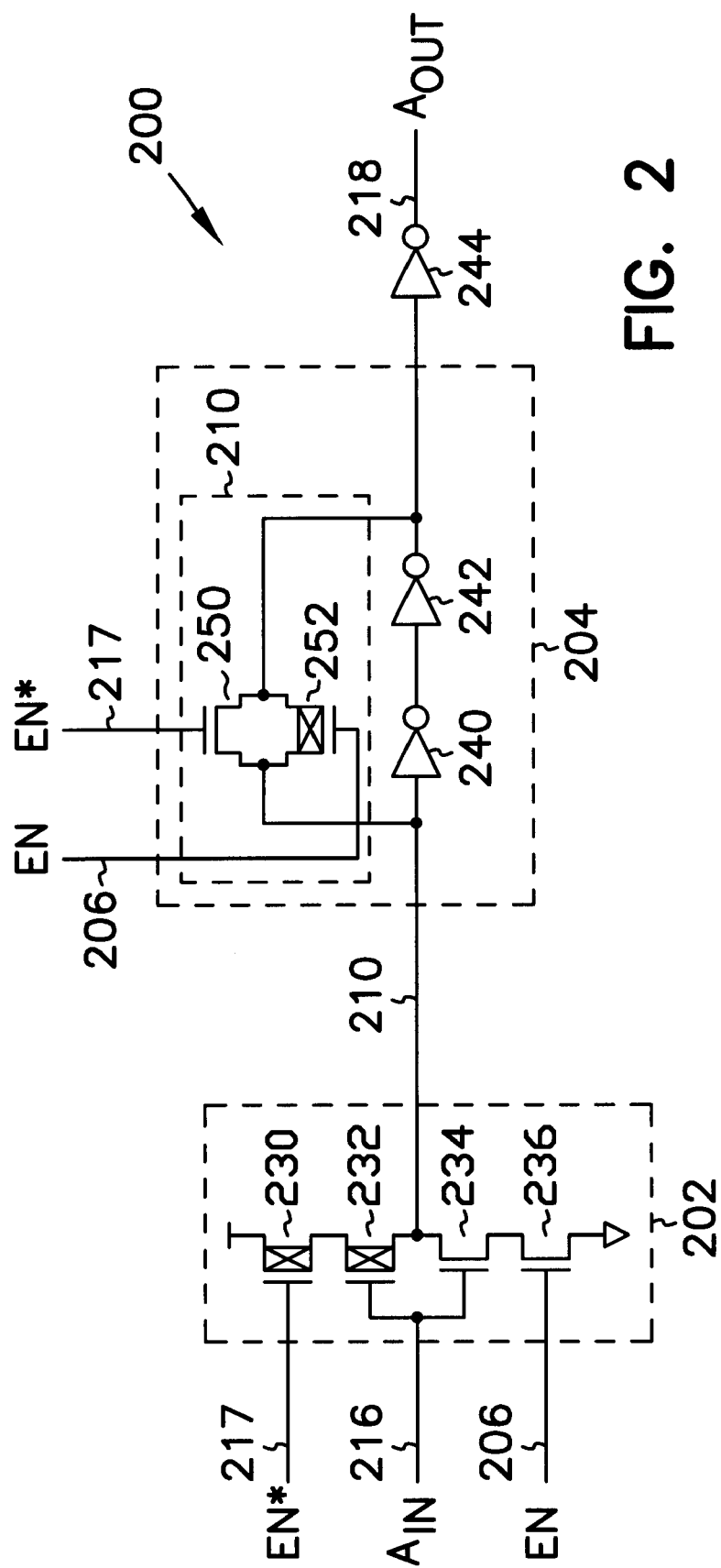
FIG. 2 is a schematic diagram of a buffer constructed in accordance with the present invention.

In FIG. 2, an address buffer is shown at 200. The buffer 200 includes successively coupled tri-state input stage 202, address output latch 204, and first inverter 244. The tri-state input stage 202 includes first, second, third, and fourth transistors 230, 232, 234, 236 coupled in series. Signal $A_{IN}$ 216 is coupled to inputs, or gates, of the second and third transistors 232 and 234. Signal EN* 217 is coupled to an input, or gate, of the first transistor 230. Signal EN (or address enablement signal) 206 is coupled to an input, or gate, of the fourth transistor 236.

Signal EN* 217 is the compliment of signal EN 206. The first and second transistors 230, 232 may be P channel metal-oxide-semiconductor field effect transistors (MOSFETs). The third and fourth transistors 234, 236 may be N channel MOSFETs. An output of the tri-state input stage 202 is formed by the source and drain of the second and third transistors 232, 234 respectively, and is coupled to an input of the address output latch 204 via line 210.

The address output latch 204 includes series coupled second and third inverters 240, 242, and a multiplexor (MUX) 210. The MUX 210 is a switch, and includes fifth and sixth transistors 250, 252 coupled in parallel. The fifth and sixth transistors 250, 252 may be respectively N and P channel MOSFETs. The MUX 210 is coupled in parallel with the second and third inverters 240, 242 to form a feedback loop. $A_{OUT}$ 218 is coupled from the output of the first inverter 244.

The MUX 210 is used to enable the feedback path in the address output latch 204 effectively latching the output state of the tri-state input stage 202. The MUX 210 is not in the speed path of the sampled address signal and is controlled by signals EN 206 and EN* 217 which are coupled to the inputs, or gates, of transistors 252 and 250 respectively. This provides a significant increase in speed over prior art buffers where a multiplexor is placed directly in the speed path.

In one embodiment, the buffer 200 is used in an address buffer in a dynamic random access memory (DRAM). One buffer 200 is used for each address bit. In one embodiment, the DRAM uses a single set of address buffers to latch both row and column addresses. The operation of a multibit address buffer including multiple buffers 200 will now be described, with respect to the timing diagrams shown in FIG. 3. Initially, a valid row address is presented as the address signal 216 to the inputs of the address buffer, indicated at (1) in FIG. 3. Then, the voltages of signals EN and EN* 206, 217 are respectively transitioned to relatively high and low levels, as indicated at (2) in FIG. 3. The row address should remain valid for at least ten nanoseconds after the transition begins. The tri-state input stages 202 are then turned on. As a result, the address signal 216, which is the row address, is sampled, inverted and coupled to the address output latches 204. Specifically, the second and third transistors 232, 234 are activated. However, the MUXes 210, and thus the feedback paths, in the address output latches 204 are disabled.

Figure 3:
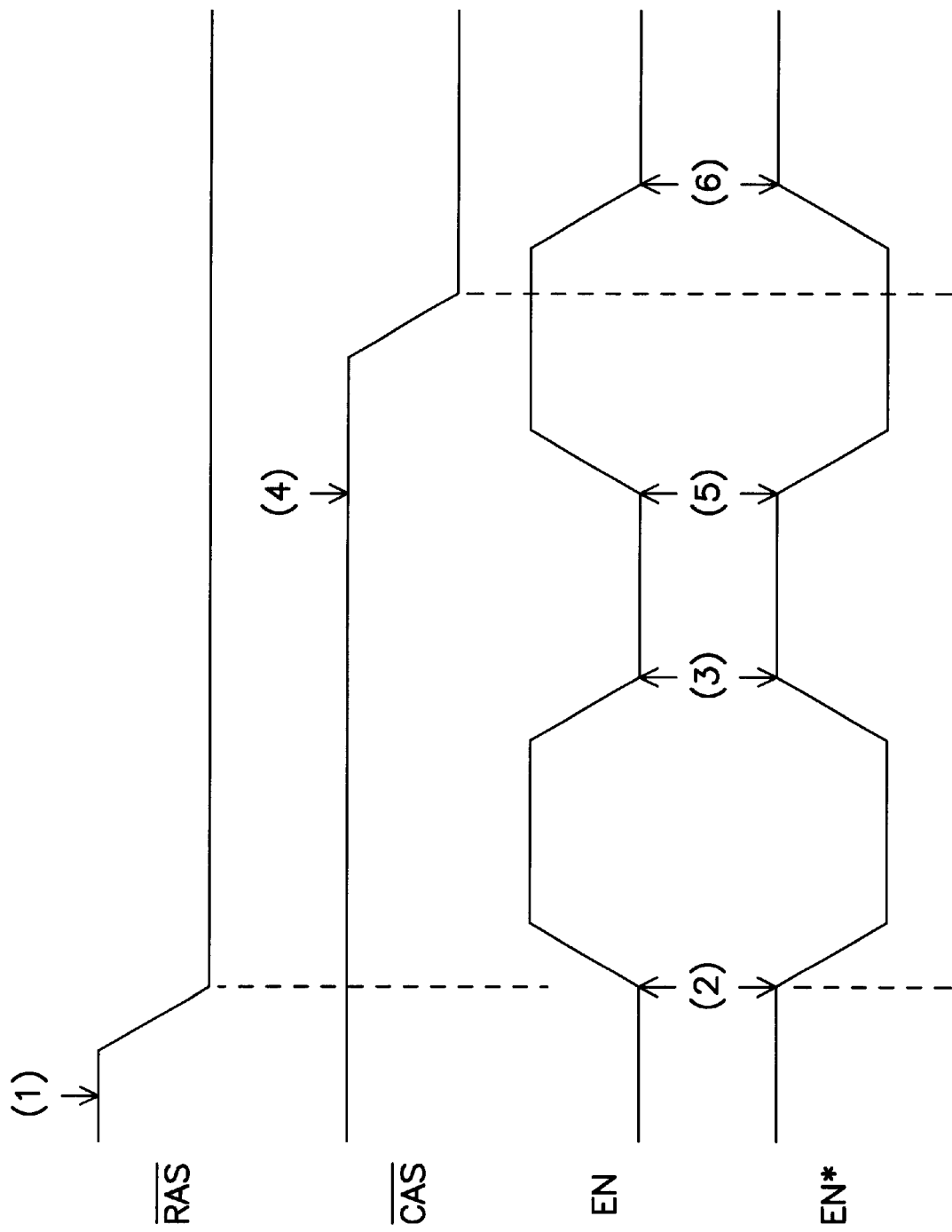
FIG. 3 is a timing diagram of signals associated with the buffer of FIG. 2 in a dynamic random access memory.

Next, the voltages of signals EN and EN* 206, 217 are respectively changed relatively low and high levels, as shown by (3) in FIG. 3. As a result, the feedback paths through the MUXes 210 are selectively activated. The combination of the MUXes 210, second inverters 240, and third inverters 242 latch the inverted address signal present at the inputs of the address output latch 204. Specifically, the fifth and sixth transistors 250, 252 are turned on. The first inverter 244 then inverts the latched inverted address signals. Hence, the latched address signals 218 are equivalent to the sampled address signals. Subsequently, other DRAM circuitry, such as a row address decoders, coupled to the output of the address buffer, can then process the latched address signals 218.

The tri-state input stages 202 are turned off, and do not sample data, when the MUXES 210 are activated by signals EN 206 and EN* 217. Thus, operation of the tri-state input stages 202 and the address output latches 204 are mutually exclusive in this embodiment. In further embodiments, separate signals may be used for controlling the tri-state input stage 202 and the MUX 210, but should have similar timing.

Next, a valid column address is presented as the address signal 216 at the inputs of the address buffer, indicated at (4) in FIG. 3. The column address is sampled and latched by the methods described above, and respectively indicated at (5) and (6) in FIG. 3. Then, the latched address signal 218 is coupled to and processed by other DRAM circuitry, such as a column address decoders. When the column address is sampled, indicated at (5) in FIG. 3, the MUXes 210 are disabled. Thus, the row address is no longer latched at the outputs of the address output latches 204.

Figure 4:
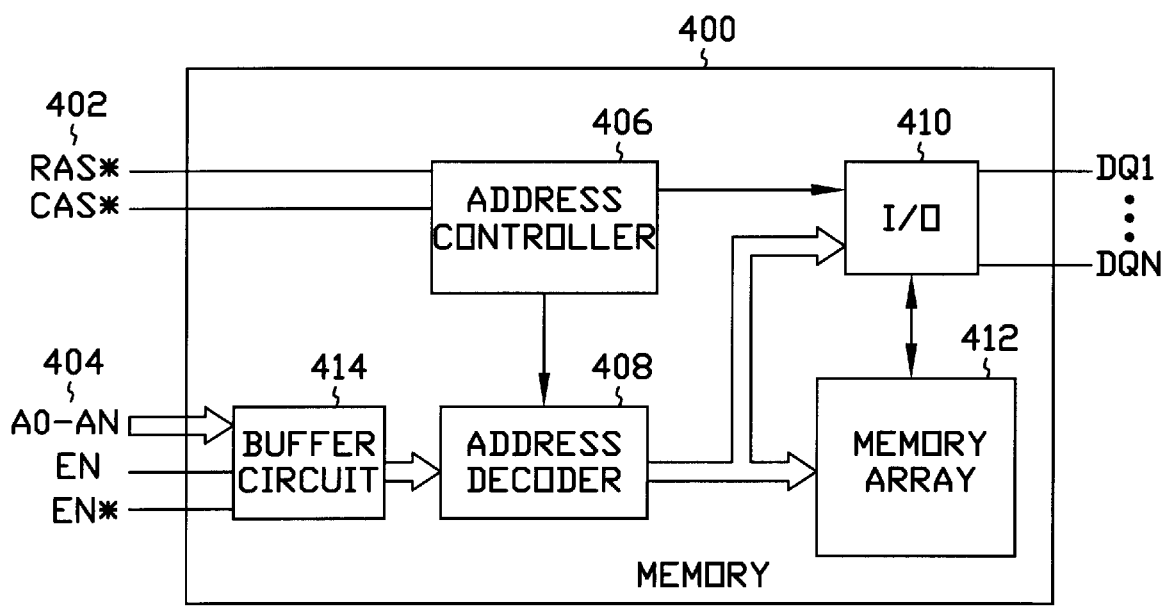
FIG. 4 is a block diagram of a dynamic random access memory incorporating the buffer of FIG. 2.

A DRAM 400 is implemented with a buffer circuit 414 comprising multiple buffers 200, as illustrated in FIG. 4. The buffer circuit 414 includes at least one buffer 200 for each bit of an address input 404. The buffer circuit 414 is coupled between the address input 404 and an address decoder 408. The address decoder 408 is coupled to an address controller 406, input/output circuit 410 and memory array 412. The address controller 406 receives row and column access signals indicated at 402. The address decoder 408 includes row and column address decoders.

The memory array 412 includes rows and columns of memory cells. A memory cell is selected with externally provided row and column addresses which are buffered using the method described above.

It should be noted that for many transistors, the sources and drains are essentially interchangeable, and interconnections specified herein should not be interpreted as solely limited to those described. In addition, while some transistors were described as an N channel transistors, it is recognized by those skilled in the art that P channel transistors may also be used. Other types of switches, instead of the MUX 210, may also be used in the feedback loop. Furthermore, because the present invention can be used as a buffer, generally, terms, such as input and output signals, or data and latched data signals, may be interchanged for the terms address and latched address signals. Those skilled in the art will readily recognize that the present invention may be utilized as an input buffer for input signals other that address input signals.

I claim:

1. A dynamic random access memory (DRAM), comprising:
   an address buffer, comprising:
      a tri-state input stage; and
      an address output latch operatively coupled to the tri-state input stage, comprising:
         a first inverter;
         a second inverter operatively coupled to the first inverter;
         a multiplexor operatively coupled in parallel with both the first and second inverters; and
         wherein the multiplexor is operatively coupled to the enablement and enablement complement signals;

an address decoder operatively coupled to the second inverter of the address buffer;

an address controller operatively coupled to the address decoder;

a memory array operatively coupled to the address decoder; and an input/output circuit operatively coupled to the address decoder, address controller, and memory array.

2. The dynamic random access memory (DRAM) of claim 1 wherein the multiplexor comprises an n-channel transistor and a p-channel transistor in parallel and having their respective gates coupled to complementary control signals and operable for providing a controllable feedback path from the input to the output.

3. The dynamic random access memory (DRAM) of claim 1 wherein the multiplexor comprises first and second transistors in parallel.

4. A memory device, comprising:

a plurality of memory cells;

an address buffer connected to the plurality of memory cells, having:

a tri-state input stage connected to receive a signal; and an address output latch for latching the signal, having an input coupled to the tri-state input stage, an output and at least two gates between the input and the output, and a multiplexor operatively coupled in parallel with the at least two gates for selectively latching the signal.

5. The memory device of claim 4 wherein the at least two gates comprises at least two inverters.

6. The memory device of claim 4 wherein the multiplexor comprises a switch coupled to provide an output of one of the inverters to an input of another inverter when the switch is on.

7. The memory device of claim 4 wherein an enable signal activates both the tri-state input stage and the multiplexor.

8. The memory device of claim 4 wherein the tri-state input stage comprises a stacked coupled N and P channel transistors.

9. The memory device of claim 4 wherein the multiplexor comprises an n-channel transistor and a p-channel transistor in parallel and having their respective gates coupled to complementary control signals and operable for providing a controllable feedback path from the input to the output.

10. The memory device of claim 4 wherein the multiplexor comprises first and second transistors in parallel.

11. A memory device, comprising:

a plurality of memory cells; and a plurality of address buffers connected to the plurality of memory cells, each having:

a tri-state input stage connected to receive a signal; and an address output latch for latching the signal, having an input coupled to the tri-state input stage, an output and at least two gates between the input and the output, and a multiplexor operatively coupled in parallel with the at least two gates for selectively latching the signal.

12. The memory device of claim 11 wherein each address buffer is associated with an address bit.

13. The memory device of claim 11 wherein a single set of address buffers latches both a plurality of row addresses and a plurality of column addresses.

14. The memory device of claim 11 wherein the at least two gates comprises at least two inverters.

15. The memory device of claim 14 wherein the multiplexor comprises a switch coupled to provide an output of one of the inverters to an input of another inverter when the switch is on.

16. The memory device of claim 11 wherein an enable signal activates both the tri-state input stage and the multiplexor.

17. The memory device of claim 11 wherein the tri-state input stage comprises a stacked coupled N and P channel transistors.

18. The memory device of claim 11 wherein the multiplexor comprises an n-channel transistor and a p-channel transistor in parallel and having their respective gates coupled to complementary control signals and operable for providing a controllable feedback path from the input to the output.

19. A system, comprising:

a processor; and a memory device coupled to the processor, comprising:

a plurality of memory cells;

an address buffer connected to the plurality of memory cells, having:

a tri-state input stage connected to receive a signal; and an address output latch for latching the signal, having an input coupled to the tri-state input stage, an output and at least two gates between the input and the output, and a multiplexor operatively coupled in parallel with the at least two gates for selectively latching the signal.

20. The system of claim 19 wherein the at least two gates comprises at least two inverters.

21. The system of claim 19 wherein the multiplexor comprises a switch coupled to provide an output of one of the inverters to an input of another inverter when the switch is on.

22. The system of claim 19 wherein an enable signal activates both the tri-state input stage and the multiplexor.

23. The system of claim 19 wherein the tri-state input stage comprises a stacked coupled N and P channel transistors.

24. The system of claim 19 wherein the multiplexor comprises an n-channel transistor and a p-channel transistor in parallel and having their respective gates coupled to complementary control signals and operable for providing a controllable feedback path from the input to the output.

25. A method of addressing a memory comprising:

inputting a row address to a tri-state input stage;

enabling the tri-state input stage;

latching the row address to an address output latch being sent from the tri-state input stage wherein the address output latch having an input coupled to the tri-state input stage, an output and at least two gates between the input and the output, and a multiplexor operatively coupled in parallel with the at least two gates for selectively latching the row address;

enabling the multiplexor;

latching the row address to the multiplexor; and outputting the row address from the address output latch.

26. The method of claim 25 further comprising inputting the row address to an address decoder, wherein the address decoder is operatively coupled to the address output latch.

27. The method of claim 25 further comprising:

inputting a column address to a tri-state input stage;

enabling the tri-state input stage;

latching the column address to an address output latch being sent from the tri-state input stage wherein the address output latch having an input coupled to the tri-state input stage, an output and at least one gate between the input and the output, and a multiplexor operatively coupled in parallel with the at least one gate for selectively latching the column address;

enabling the multiplexor;

latching the column address to the multiplexor; and outputting the column address from the address output latch.

28. The method of claim 25 further comprising inputting the column address to an address decoder, wherein the address decoder is operatively coupled to the address output latch.

29. The method of claim 25 wherein the tri-state input stage and the address output latch are operated mutually exclusively.

30. The method of claim 25 wherein the multiplexor comprises an n-channel transistor and a p-channel transistor in parallel and having their respective gates coupled to complementary control signals and operable for providing a controllable feedback path from the input to the output.

31. The method of claim 25 wherein the multiplexor comprises first and second transistors in parallel.

* * * * *